US006222786B1

(12) United States Patent
Holland et al.

(10) Patent No.: US 6,222,786 B1
(45) Date of Patent: Apr. 24, 2001

(54) DYNAMIC RANDOM ACCESS MEMORY WITH WRITE-WITHOUT-RESTORE AND SYSTEMS AND METHODS USING THE SAME

(75) Inventors: Wayland Bart Holland, Dallas; Craig Waller, Garland; Jason Stevens, Plano; Gary Johnson, Melissa, all of TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/432,307

(22) Filed: Nov. 2, 1999

(51) Int. Cl.$^7$ ........................................... G11C 7/00
(52) U.S. Cl. ..................... 365/222; 365/49; 365/230.05
(58) Field of Search ............................ 365/230.05, 222, 365/49, 230.03

(56) References Cited

U.S. PATENT DOCUMENTS

| | | | |
|---|---|---|---|
| 4,800,530 | 1/1989 | Itoh et al. | 365/189.12 |
| 5,007,022 | 4/1991 | Leigh | 365/189.04 |
| 5,010,519 | 4/1991 | Yoshimoto et al. | 365/149 |
| 5,323,350 | 6/1994 | McLaury | 365/208 |
| 5,442,588 | 8/1995 | Runas | 365/222 |
| 5,781,482 | 7/1998 | Sakata | 365/149 |
| 5,812,469 * | 9/1998 | Nadeau-Dostie et al. | 365/230.05 |
| 5,923,593 | 7/1999 | Hsu et al. | 365/189.04 |

OTHER PUBLICATIONS

"Transparent–Refresh DRAM (TReD) Using Dual–Port DRAM Cell" by Sakurai, Nogami, et al. 1988 IEEE Custom Integrated Circ. Conf. p. 4.3.1–4.3.4.

White, et al. "Session 17: Random Acess Memories" IEEE Int'l Solid–State Circ. Conf. Feb. 1980, pp. 230–231.

Kiyoo Itoh, et al. "Limitations & Challenges of Multigigabit DRAM Chip Design" IEEE–Soli–State Cir. vol. 32#5, May 1997, pp. 624–634.

Yashiro Takai, et al. "250 Mbytes/S Synchronous DRAM Using a 3–Stage–Pipelined Architecture" IEEE Solid–State Circ. vol.29#4 Apr. '99 pp 426–430.

NEC Prelim. Data Sheet, MOS Integrated Circuits, 64–M–bit Synchronous DRAM 4–bank, LVTTL for Rev. E. Doc. No. M12 62 1E J VOD SOO ($1^{st}$ Ed. pp. 1–82.

R. T. "Tets" Maniwa, "Focus Report: CMOS ASIC's" Integrated Design System Jul. 1997 pp 13.

John H. Mayer "Gearing Up for Systems–On–Silicon Market" Elect. Buyers' News, Aug. 4, 1997, 1069, pp. 52–54.

John L. Hennessy, et al. "Computer Architecture A Quantitative Approach" Chpt. 2 $2^{nd}$ edition, p. 67–82.

B. El–Kareh, et al. "The Evolution of DRAM Cell Technologies" Solid–State Technology May, 1997 p. 89–101.

* cited by examiner

*Primary Examiner*—Son T. Dinh
(74) *Attorney, Agent, or Firm*—James J. Murphy, Esq.; Winstead Sechrest & Minick

(57) ABSTRACT

A dynamic random access memory 400 includes an array 401 of physical rows and columns of memory cells, the cells of each row coupled to first and second wordlines 603 and first and second bitlines 602. A direct input/output data path 402 having a width equal to a width of the rows supports simultaneous writing to each of the cells along a selected row using the first wordlines and first bitlines during a single access cycle without restore.

21 Claims, 9 Drawing Sheets

DYNAMIC RANDOM ACCESS MEMORY WITH WRITE-WITHOUT-RESTORE AND SYSTEMS AND METHODS USING THE SAME

CROSS REFERENCE TO RELATED APPLICATION

This following co-pending and co-assigned application contains related information and is hereby incorporated by reference:

"LOW LATENCY MEMORIES AND SYSTEMS USING THE SAME" by inventor G. R. Mohan Rao, filed Jan. 30, 1998 and granted U.S. Pat. No. 5,963,468 on Oct. 5, 1999 ;

"DUAL PORT RANDOM ACCESS MEMORIES AND SYSTEMS USING THE SAME" by inventor G. R. Mohan Rao, filed Aug. 28, 1998 and granted U.S. Ser. No. 09/141,490, currently pending; and "DYNAMIC RANDOM ACCESS MEMORY SYSTEM WITH SIMULTANEOUS ACCESS AND REFRESH OPERATIONS AND METHODS FOR USING THE SAME" by inventor Wayland Bart Holland, filed May 18, 1998 and granted U.S. Pat. No. 5,963,497 on Oct. 5, 1999.

TECHNICAL FIELD OF THE INVENTION

The present invention relates in general to electronic memories and in particular to a dynamic random access memory with write-without-restore and systems and methods using the same.

BACKGROUND OF THE INVENTION

Currently available dynamic random access memories (DRAMs) are generally based upon architectures which share the following characteristics. First, the typical general purpose DRAM has a single data port for writing and reading data to and from addressed storage locations ("dual ported" DRAMs are available which provide two data ports, typically one random and one serial port, however, these devices are normally limited to special memory applications). Second, data writes and reads are only made on a location by location basis, with each location typically being one bit, one byte or one word wide. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PCs) generally share a number of common features. For example, the vast majority of today's PCs are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, let alone in a multiprocessing PC environment.

Thus, the need has arisen for new memory and system architectures to meet the ever increasing demands for faster processing and greater memory capacity. Such architectures should be comprehensive and cost effective. In other words, a total system solution is required.

SUMMARY OF THE INVENTION

A dynamic random access memory includes an array of physical rows and columns of memory cells, the cells of each row coupled to first and second wordlines and the cells of each column coupled to first and second bitlines. A direct input/output data path having a width equal to a width of the rows is provided for simultaneously writing to each of the cells along a selected row using the first wordlines and first bitlines during a single access cycle without restore.

The principles of the present invention have substantial advantages over the prior art. Among other things, since data are written to an entire row or row segment of memory cells at once, the sense and restore operations to the non-accessed cells along the active row, normally part of a conventional write, can be eliminated. This allows write operations to be performed at a substantially greater rate than prior art memories. Moreover, the use of 2T-1C cells supports transparent refresh and precharge. Finally, embodiments include spatial and temporal cache for further increasing the efficiency of data accesses to the memory.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–9 of the drawings, in which like numbers designate like parts.

Figure 1A:
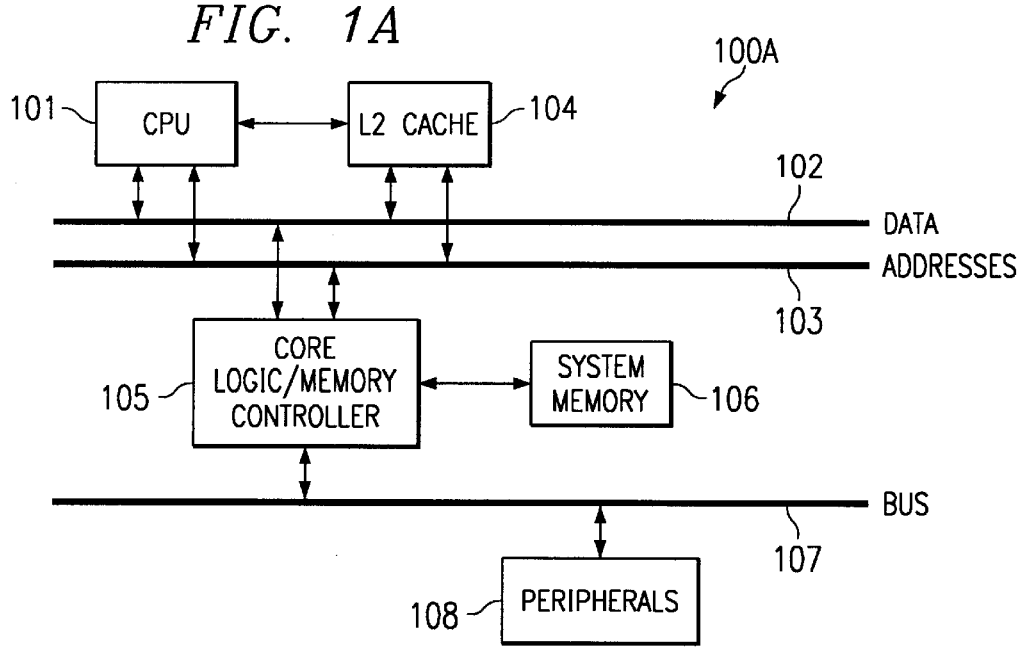
FIGS. 1A and 1B are block diagrams respectively depicting two basic system architectures 100A and 100B typical of those found in personal computers (PCs)
Figure 1B:
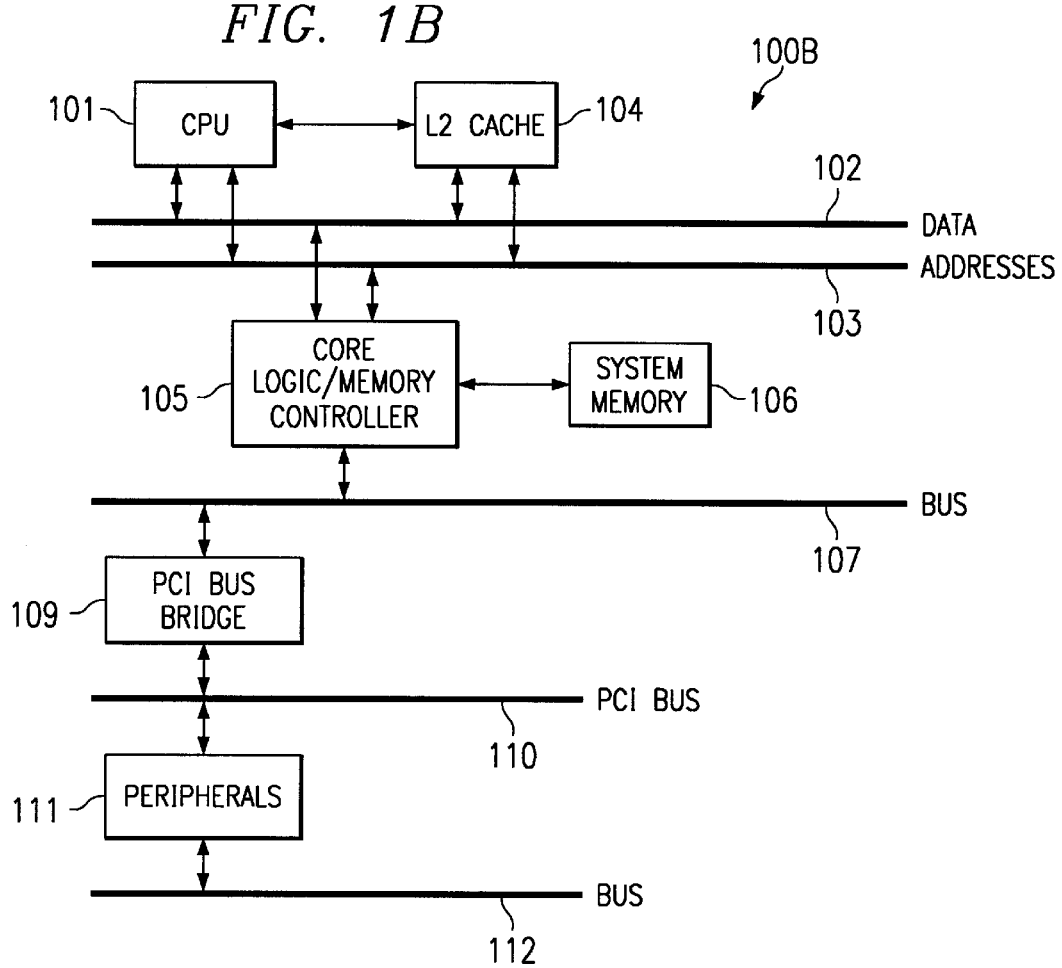

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/ memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium or Merced class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/ memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common memory and all data sharing between processors occurs over communications links. NORMA typically is used in fully distributed systems.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a unified memory access (UMA) architecture. Under the UMA paradigm, all processors have equal access to system memory and all processors have local cache. The unified memory access architecture typically provides the fastest possible interaction between processors and is the common architecture used in PCs, work stations, and other desktop computing devices. UMA based systems are often referred to as "symmetric-multiprocessing" systems.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

Figure 2A:
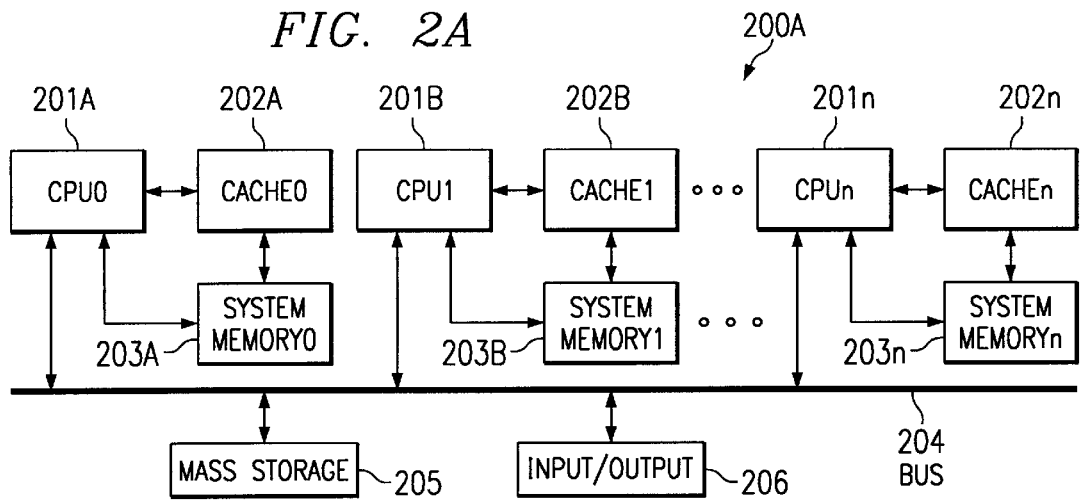
FIG. 2A depicts a multiprocessing system in which each processor operates in conjunction with private system memory.
Figure 2B:
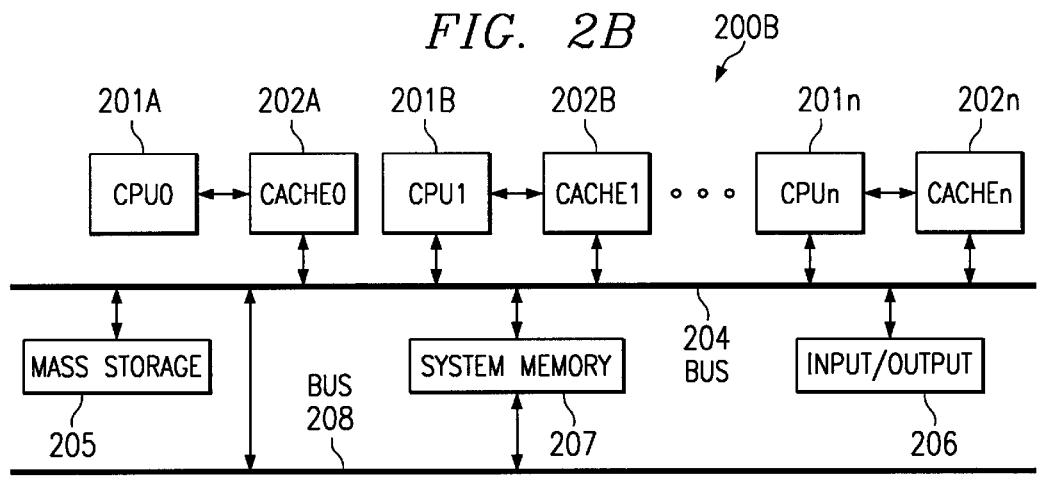
FIG. 2B depicts a multiprocessing system in which each processor operates in conjunction with a public system memory.
Figure 2C:
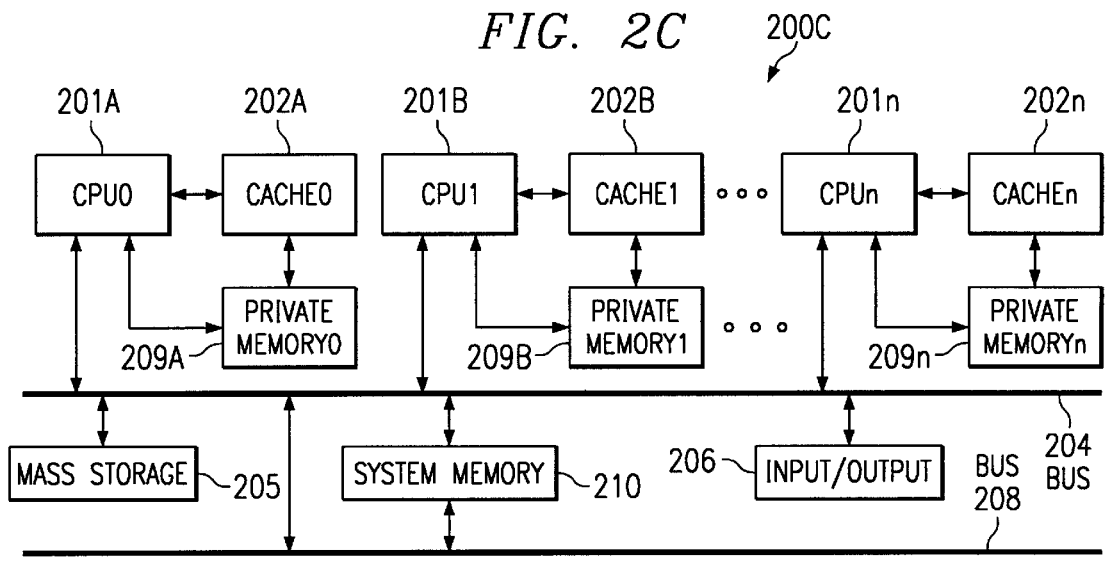
FIG. 2C depicts a multiprocessing system in which each processor operates in conjunction with both private memory and public system memory.

At the highest system level, there are a number of ways to implement the hardware architectures shown in FIGS. 2A, 2B and 2C in a complete hardware/software system. Three such systems are shown in FIGS. 3A–3C, respectively.

Figure 3A:
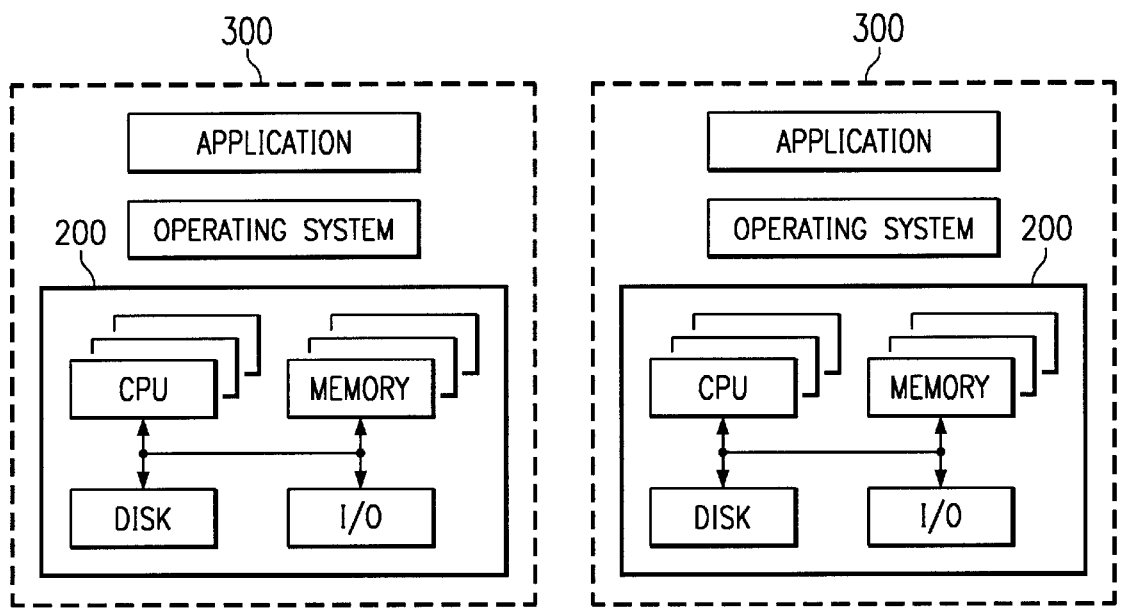
FIG. 3A is a diagram illustrating a "loosely coupled" multiprocessing architecture in which each processing node maintains a dedicated copy of the operating system and a dedicated copy of the applications program.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
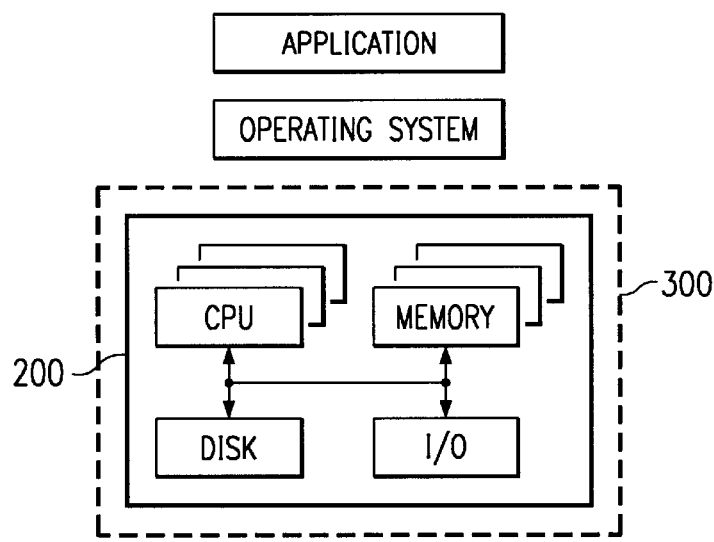
FIG. 3B depicts a "lightly coupled" multiprocessing system in which all processing nodes share a single copy of the operating system and a single copy of the applications program.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
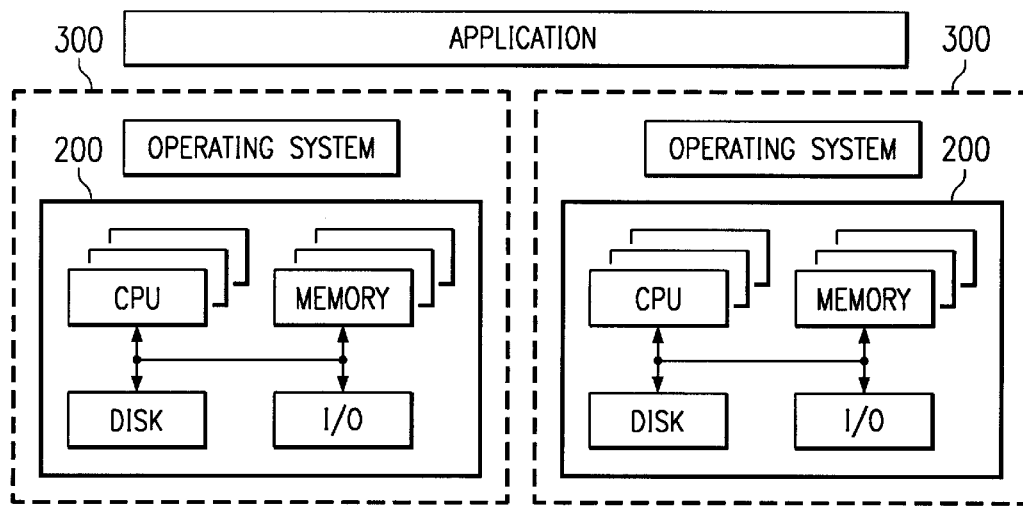
FIG. 3C is a diagram of a "snugly coupled" multiprocessing system in which each processing node maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
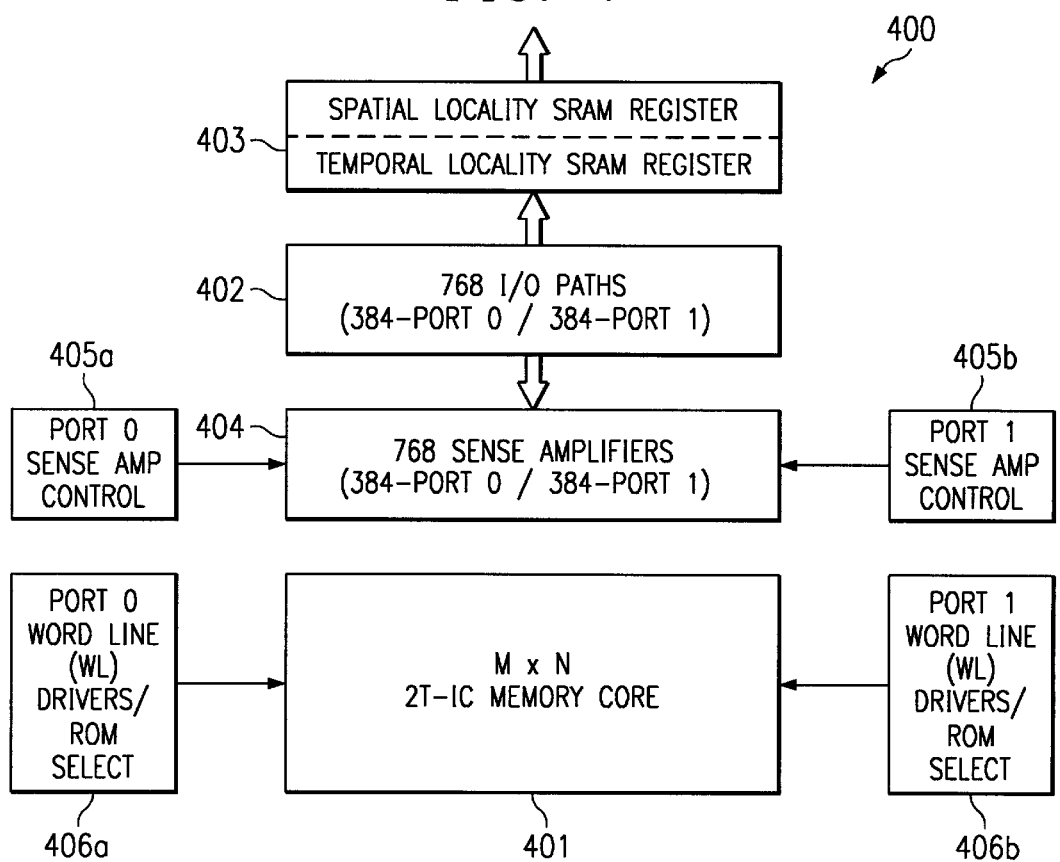
FIG. 4 is a high level block diagram of a memory embodying the present inventive principles and suitable use in the memory subsystems depicted in FIGS. 1 and 2.

FIG. 4 is a high level block diagram of a memory 400 suitable use in the memory subsystems described above. Generally, memory 400 is a high speed single-chip device utilizing a core 401 of 2-transistor, 1-capacitor (2T-1C) dynamic random access memory cells and dual-ported direct input/output (I/O) 402. Moreover, subwordline widths are equal to the I/O widths for fast write-without-restore operations. Refresh and precharge can be transparent. Additionally, memory 400 includes integrated SRAM cache 403 supporting spatial and temporal data caching. Each port is associated with its own set of sense amplifiers 404, sense amplifier controls 405, and wordline select circuitry 406 which will be discussed in detail below.

Figure 5:
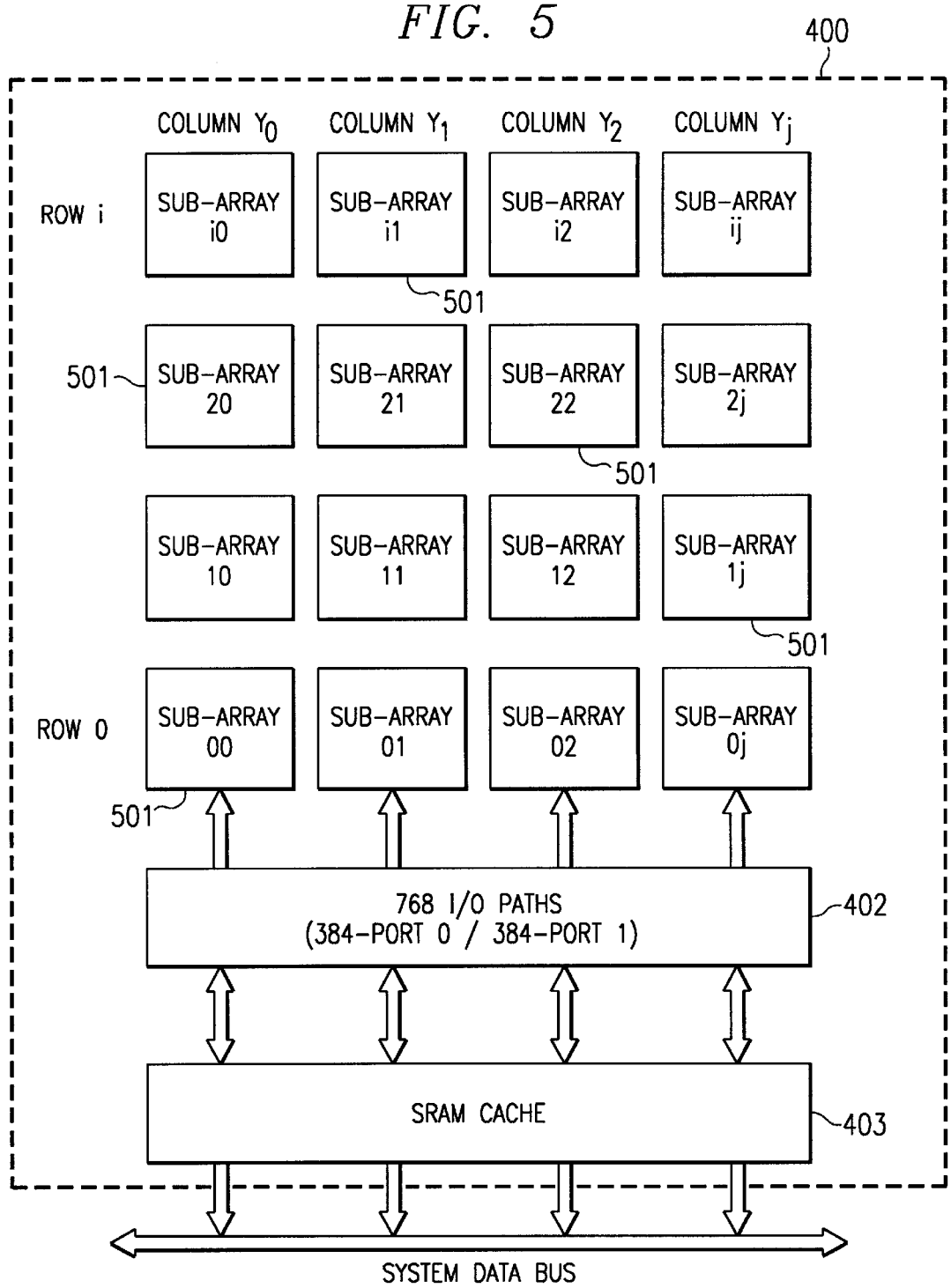
FIG. 5 is a more detailed diagram illustrating one possible partitioning of the array of FIG. 4 into subarrays.

In the illustrated embodiment, memory 400 is organized as a plurality of subarrays 501 as shown in FIG. 5. Specifically, in FIG. 5 there are (i+1) number of subarray rows and (j+1) number of subarrays columns. As will be discussed below, each column of subarrays is one logical column wide and controlled by corresponding pairs column control lines $Y_j$ which are used to control two Ports 0 and 1. The width of the rows, and correspondingly the length of the controlling subwordline, are equal in width to the corresponding port. In the illustrated embodiment, an asynchronous transfer mode (ATM) switch application is being contemplated, and therefore each port consists of 384 I/O paths (i.e one logical column 384 bits wide). The I/O paths include the data latches, read and write amplifiers and similar traditional I/O circuitry which support the inventive direct I/O. Each I/O path is associated with a pair of SRAM cache registers 403, one for temporal and one for spatial locality, each also one 384-bit logical column wide.

Figure 6:
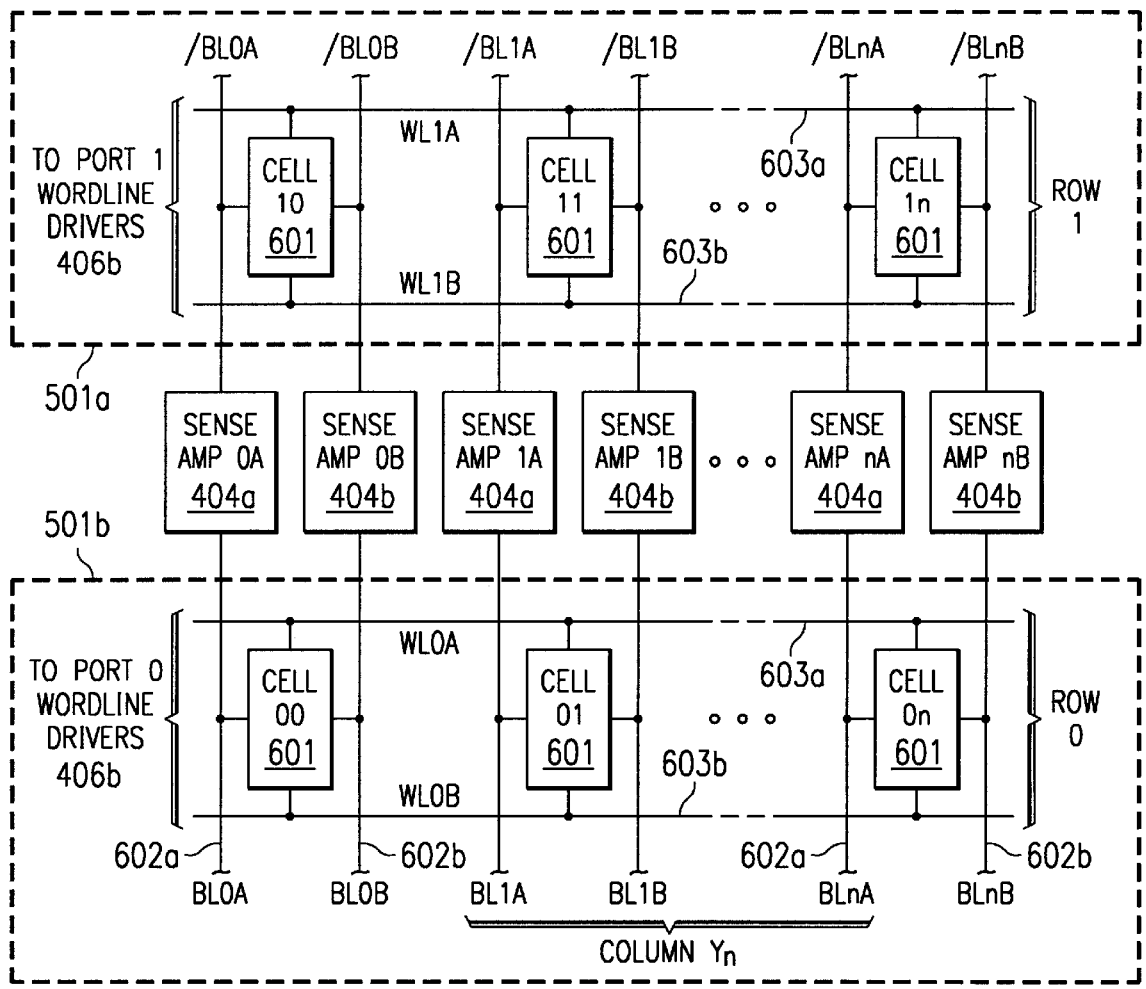
FIG. 6 depicts a portion of one of the subarrays of FIG. 5 and the corresponding sense amplifiers.

FIG. 6 depicts a portion of subarrays 501 and the corresponding sense amplifiers 404. Specifically, FIG. 6 shows three exemplary physical columns (Columns 0, 1 and n) and two exemplary rows (Rows 0 and 1) of an m row by n column array, with half of the rows disposed in each of half-subarrays 501a and 501b. In actual implementation the number of rows and columns will be much larger, the array could be, for example, 1024 rows by 1024 columns (i.e. m=n=1024) or larger. In the ATM switch embodiment the number of columns per subarray 501 is 384, as discussed above.

In the illustrated embodiment of FIG. 6, an open bitline arrangement is employed, although a folded bitline approach could also be used. Each cell 601 in each half-subarray is coupled to a pair of bitlines 602a and 602b (labeled $BL_iA$ and $BL_iB$, where i is the column number between 0 and n) and a pair of wordlines 603a and 603b (labeled $WL_jA$ and $WL_jB$, where j is the row number between 0 and m). Each bitline 602a/602b of each column is coupled to a corresponding dedicated sense amplifier 603a or 603b, with the corresponding bitlines of half-subarrays 501a and 501b coupled to the same sense amplifier 603 being complementary. For illustration, the even numbered pairs of wordlines 603 are shown in half-subarray 501b and the odd numbered pairs shown in subarray 502a. Port 0 will be associated with wordlines $WL_jA$ and bitlines $BL_iA$ and Port 1 with wordlines $WL_jB$ and bitlines $BL_iB$.

Figure 7:
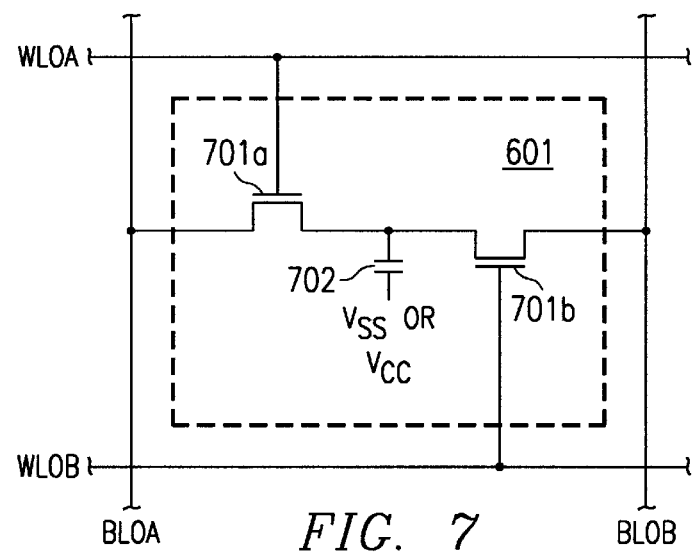
FIG. 7 is an electrical schematic diagram of a selected memory cell shown in FIG. 6.

Cells 601 are preferably constructed as the 2-transistor, 1-capacitor (2T-1C) cell depicted in FIG. 7. For discussion purposes, the cell at the intersection of wordlines $WL_0A$ and $WL_0B$ and bitlines $BL_0A$ and $BL_0B$ is shown for reference. Each cell includes a first pass transistor 701a for coupling a first plate of data storage capacitor 702 with bitline $BL_0A$ in response to active (high) voltage impressed on $WL_0A$. A second pass transistor 701b similarly selectively couples the storage capacitor 702 to bitline $BL_0B$ when an active (high) voltage is presented on wordline $WL_0B$. For a complete description of cells 301 and their advantages, reference is now made to copending and coassigned patent grant U.S. Pat. No. 5,856,940, filed Aug. 15, 1997 and granted Jan. 5, 1999, entitled "LOW LATENCY DRAM CELL AND METHOD THEREFOR" and patent application Ser. No. 09/016,559, filed Jan. 30, 1998 and still pending, entitled "LOW LATENCY MEMORIES AND SYSTEMS USING THE SAME" , both incorporated herein by reference.

According to the principles of the present invention, selected rows in array 401 can be written to while other selected rows are simultaneously refreshed. Moreover, both reads and writes can be interleaved between ports. Generally, simultaneous access and refresh operations can be accomplished by using one bitline of each column and one wordline of each row for data accesses and the other bitline of each column and the other wordline of each row for refresh. Although other configurations are possible, for ease of discussion, assume that addresses are internally generated for refresh and decoded to access wordlines $WL_jA$, with refresh effectuated by bitlines $BL_iA$ and the corresponding sense amplifiers 504a. Consequently, received addresses for data accesses are decoded to exclusively access wordlines and bitlines $WL_jB$ and $BL_iB$ through sense amplifiers 504b.

Figure 8:
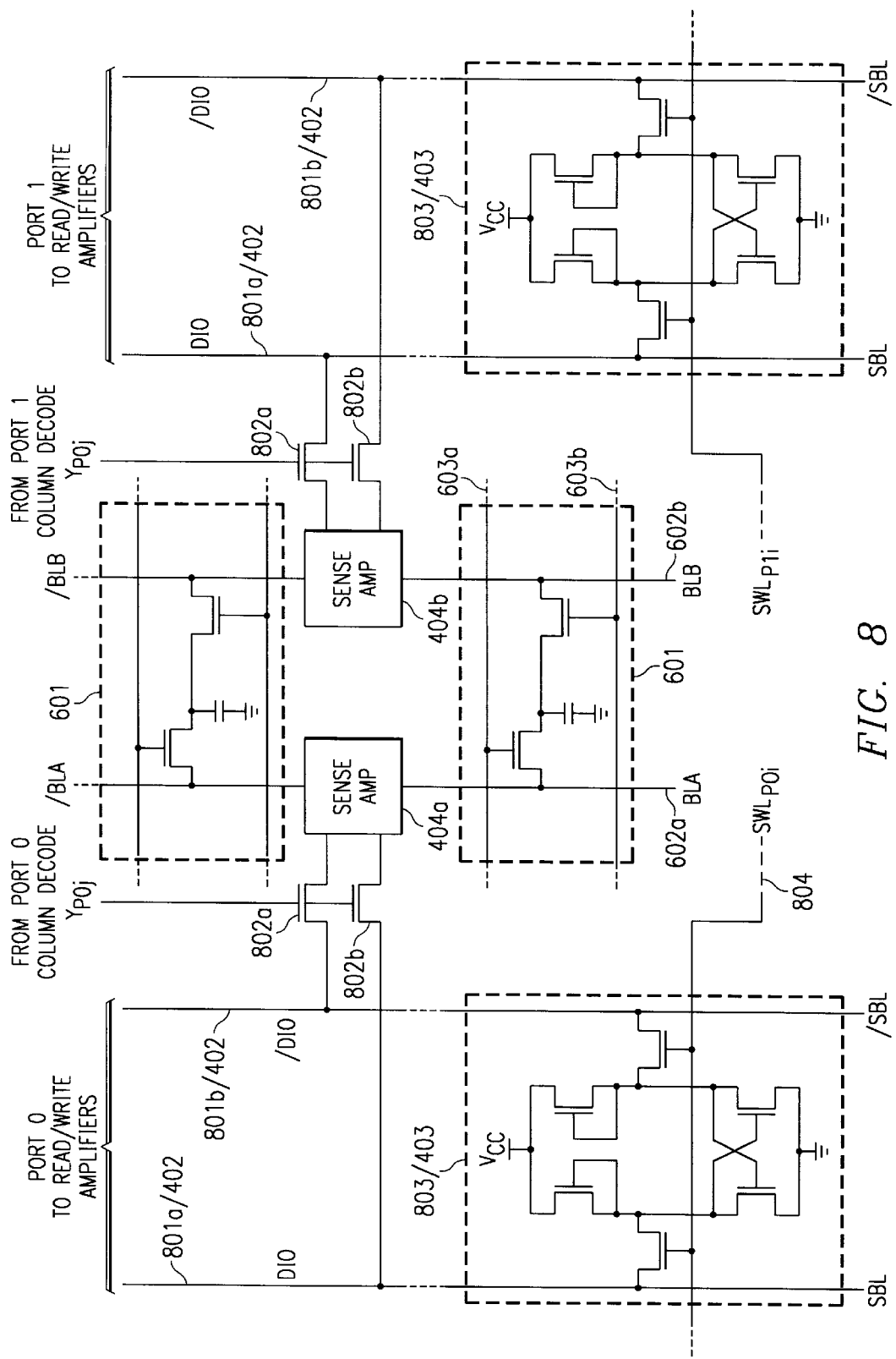
FIG. 8 is a more detailed schematic diagram depicting a direct I/O interface between the DRAM sense amplifiers of FIG. 5 and the corresponding bitlines of an SRAM array (register) of FIG. 5 for a given memory subarray.

FIG. 8 is a more detailed schematic diagram depicting a direct I/O interface between DRAM sense amplifiers 404, direct I/O lines 801/402, and the corresponding bitlines of one SRAM array (register) 403 (e.g., the temporal cache) for a given memory subarray 501. (The second SRAM register for the column (e.g., the spatial cache) is similarly constructed and coupled to the direct I/O lines) 801/402.

The columns and bitlines in DRAM array 501 corresponding one-to-one with the columns and bitlines in SRAM array (register) 403. Two DRAM sense amplifiers for the two bitlines $BLA_i$ and $BLB_1$ along with their complements $/BLA_i$ and $/BLB_1$, for an arbitrarily selected column in DRAM array and two SRAM cells 803 are shown for reference. The SRAM cells 803 depicted in the figure are generic SRAM cells widely known by those skilled in the art; however, other SRAM cell configurations may be used. The structure shown in FIG. 6 is repeated for the remaining columns in DRAM subarray 501 and SRAM array 403. One SRAM wordline (SWL) 804 corresponding to one row of SRAM cells 803 is depicted.

Each DRAM sense amplifier 404 (and hence each column of DRAM cells) and each corresponding column of SRAM cells 803 is associated with a pair of complementary direct input/output (I/O) lines (DIO and /DIO) 801. Direct I/O lines 801 directly exchange data with the complementary SRAM bitlines SBL and/SBL and SRAM cells for each column (i.e., direct I/O from the DRAM columns), as well as the device read/write amplifiers and buffers. In the preferred embodiment, the SRAM bitlines SBL and /SBL are simply extensions of I/O lines 801; however, this is not mandatory. Each column of SRAM cells could be associated with a discrete pair of bitlines which are in turn coupled or connected to discrete I/O bitlines 801.

During an SRAM array load operation, discussed in further detail below, the SRAM wordline SWL for the corresponding SRAM register is activated. Data are then selectively transferred from the cells of the active DRAM row (segment), sensed and latched by sense amplifiers 404 and presented on direct I/O lines 801 through transistors 802 in response to column control signals (Y). These Y-line signals are generated by the column decoder, also discussed below. When a cache hit occurs to the given register, the corresponding SRAM wordline SWL is activated and the data directly output on direct I/O lines 801.

Figure 9A:
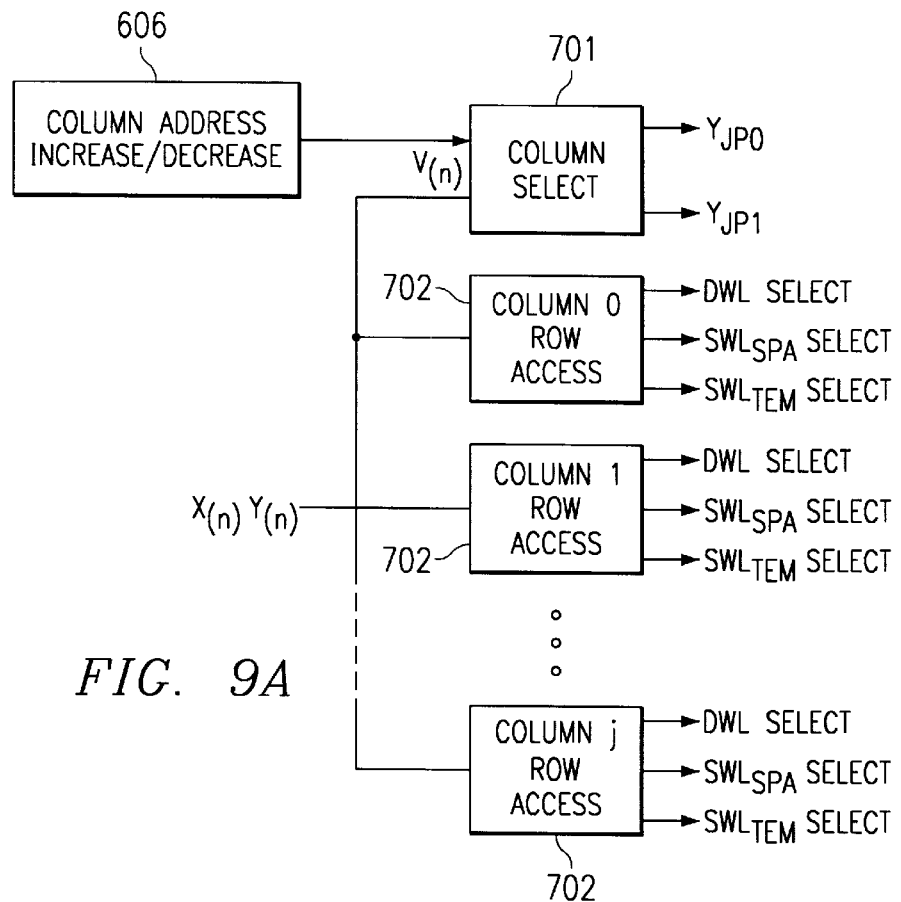
FIGS. 9A and 9B are more detailed diagrams emphasizing the data and address routing circuitry of the memory of FIG. 4.
Figure 9B:
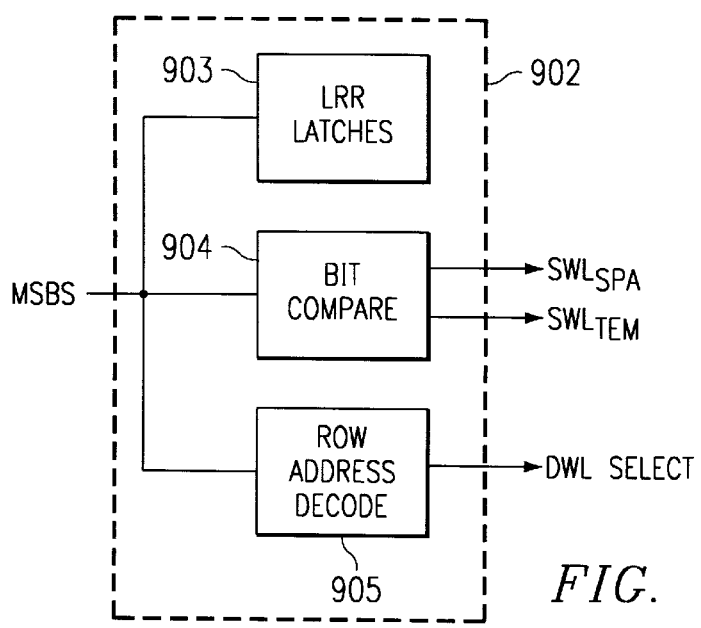

FIGS. 9A and 9B are more detailed diagrams emphasizing the data and address routing circuitry of a memory 400. Row addresses X(i) and Y(j) can be received in either a multiplexed (switched by a clock or strobe) or non-multiplexed fashion. In the illustrated embodiment, for a complete address word X(i)Y(j), the row address bits X(i) are the most significant bits and the column address bits Y(j) are the least significant bits.

Column address bits Y(j) are decoded by column selector 901 and a column select signal $Y_{P0j}$ to connect the Port 0, Column j sense amplifiers 603a to the corresponding direct I/O lines 801 during a Port 0 access or a column selected signal $Y_{P1j}$ to connect Port 1, Column j sense amplifiers 603b to the corresponding direct I/O lines 801 during a Port 1 access. Column address incrementation/decrementation circuitry 906 is used to generate additional column addresses for the below discussed caching operations by incrementing or decrementing from the received (current) address.

The row address bits X(i) are passed to row access circuitry 902 for the column selected by the column address bits. The row access circuitry 902 corresponding to each column includes two sets of last row read address (LRR) latches 903 per Port. One set stores the address corresponding to the data stored in the spatial SRAM register associated with the column and port and the other set the address corresponding to the data stored in the temporal SRAM register.

Comparison circuitry 904 associated with the port being accessed compares the current row address bits X(i) with the bits stored in the LRR latches 903. If they match the address bits stored in the spatial locality latch, an SRAM wordline signal $SWL_{SPA}$ is sent to activate the corresponding SRAM register. Similarly, if the received row address bits match the contents of the temporal locality latch, an SRAM wordline signal $SWL_{TEM}$ is issued to retrieve the corresponding encached data. If no match occurs, the required data has not been encached and therefore row address bits X(i) are decoded to access the corresponding row in DRAM.

For a given column and a given port, the spatial locality cache, is updated every time an access to any DRAM subarray 501 is made and a cache miss occurs. For a given column and a given port, the temporal locality cache, is updated only when a DRAM subarray 501 in the corresponding column is accessed from an externally generated or system address. Again, in the address space, the row (X) address consists of the most significant bits of each address word and the column (Y) address consists of the least significant bits of each address word. The exact number of row and column address bits varies from implementation to implementation as a function of the number and size of the subarrays.

The operation of memory 200 can now be described with reference to FIG. 10 which is a simplified conceptual timing diagram. For discussion purposes, it will be assumed that even row addresses access Port 0 and odd row addresses Port 1, with Port 0 associated with wordlines and bitlines $WL_jA$ and $BL_jA$ and Port 1 associated with wordlines and bitlines $WL_iB$ and $BL_iB$.

Assume that an address X(1)Y(1) to Row (1), Column (1) (i.e. Subarray 11, Port 1) is received. The corresponding spatial and temporal SRAM caches for Column (1) are checked for the presence of data associated with that address. If those data are already encached in either associated cache, the access is made from cache and no cache update occurs, otherwise, Row (1), Column (1) in DRAM is accessed. Those data are copied into both the spatial and temporal caches associated with Subarray 11. Additional addresses are generated internally where the low order Y bits are incremented and/or decremented to load the spatial data caches associated with the remaining columns. In this case, the Y bits are decremented to access column Y(0) and incremented to access columns Y(2) and Y(3). The higher order X address bits stay the same such that data from the Row 1 segments of Subarrays 00, 02 and 03 are loaded into the corresponding spatial caches.

As a result of using Direct I/O accessing and the fact that each subwordline is one logical column wide, fast writes to can be made to DRAM subarrays 501 at 1× system clock (SCLK) rate using a single port. At the same time, the other port can be used for refresh operations at ½× the system clock rate. Read operations are performed at 1× the system clock rate by interleaving the ports and performing read operations to each port at ½ the system clock rate. The system clock could be for example on the order of 100 MHz. These operations are illustrated in FIG. 10.

More specifically, the principles of the present invention allow for the performance of fast write operations since the sense and restore operations normally required during conventional writes are eliminated. To elaborate, during a conventional write operation, only a selected number of cells along the selected row are actually written to. Nevertheless, all the cells along that row are coupled to the same wordline and turn-on. As a result, the charge on all the storage capacitors for that row is shared with the corresponding bitlines. Unless a sense and restore operation is performed by the sense amplifiers, the data for the non-selected cells, are lost. Hence, in conventional DRAMs, a write operation is normally a three step process: sense the data for the entire row, latch that data to their full voltages, and then write to the selected cells in accordance with the column address. This process takes a substantial amount of time. However, in the present invention, there are no non-selected cells requiring restoration during a write since a write is made to all the cells along a subwordline. Thus, the time-consuming store operating is eliminated.

Figure 10:
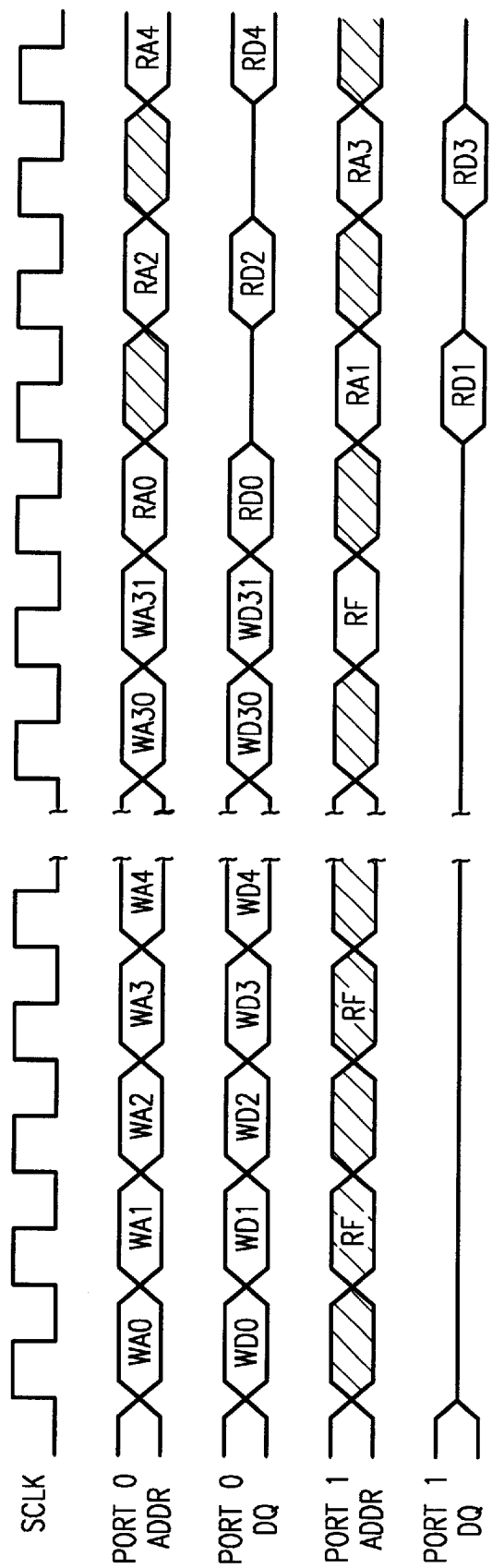
FIG. 10 is a simplified conceptual timing diagram.

In the operations shown in FIG. 10, a ATM switch application is again being assumed. Here, 32 to writes are made through Port 0, with the Port 0 write addresses labeled WAx and the data from the Port 1 output DQ labeled WDx. At half-the data rate, Port 1 is used to refresh rows of cells in the same column of subarrays using refresh addresses RF, which may be generated internally using a refresh counter. The non-accessed columns of subarrays can also be refreshed concurrently.

The 32 write operations are followed by 32 read operations. Here, the even numbered read addresses RAx are used to access even numbered read data RDx through Port 0 and odd numbered addresses RAx used to access odd numbered read data RDx through Port 1. Following the read operations, memory 400 returns to 32 write operations with concurrent refresh. In sum, memories according to the inventive concepts provide a number of substantial features. First, subwordlines having a width of one logical column eliminate restore during write operations increasing write-speed. Second, on-board spatial and temporal cache further help increase access rates. Third, the use of 2T-1C cells make transparent precharge and/or refresh possible.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A dynamic random access memory comprising:
   an array of physical rows and columns of memory cells, the cells of each row coupled to first and second wordlines and the cells of each column coupled to first and second bitlines; and
   a direct input/output data path having a width equal to a width of the rows for simultaneously writing to each of the cells along a selected row using the first wordlines and first bitlines during a single access cycle without restore.

2. The memory of claim 1 and further comprising refresh circuitry for substantially simultaneously refreshing a selected row of cells using the second wordlines and second bitlines during a write operation.

3. The memory of claim 1 and further comprising a static random access memory cell cache having a width equal to the width of the rows and coupled to the direct input/output path.

4. The memory of claim 3 wherein said cache comprises a first register for temporal data caching and a second register for spatial data caching.

5. The memory of claim 1 wherein said first and second bitlines are associated with respective first and second direct input/output paths for performing interleaved read operations to said array.

6. The memory of claim 1 wherein said array is partitioned into a plurality of subarrays, each of said subarrays having a width equal to said direct input/output path.

7. The memory of claim 1 wherein each of said memory cells comprises two-transistor, one-capacitor dynamic random access memory cells.

8. A memory device comprising:
   an array of rows and columns of two-transistor, one-capacitor dynamic random access memory cells partitioned in to a plurality of subarrays, each subarray organized as a plurality of rows each associated with first and second wordlines one logical column in width and a plurality of columns each associated with first and second bitlines;
   a first direct input/output path one logical column wide coupled to said first bitlines of a corresponding one of said subarrays; and
   a second direct input/output path one logical column wide coupled to said second bitlines of a corresponding one of said subarrays wherein data is accessed through said first direct input/output path in response to a first set of addresses decoded by first addressing circuitry and data is accessed through said second direct input/output path in response to a second set of addresses decoded by second addressing circuitry.

9. The memory device of claim 8 wherein said array is fabricated on a single integrated circuit chip.

10. The memory device of claim 8 and further comprising a cache coupled to said first direct input/output path for storing a selected one of spatially and temporally localized data.

11. The memory device of claim 8 and further comprising a cache coupled to said second direct input/output path for storing a selected one of spatially and temporally localized data.

12. The memory device of claim 8 and further comprising first and second independent sets of sense amplifiers coupled respectively to said first and second direct input/output paths.

13. The memory device of claim 10 and further comprising internal address generation circuitry for updating said cache associated with a first one of said subarrays following an access to a selected one of said subarrays.

14. A method for operating a memory device including an array of rows and columns of memory cells, the rows of cells associated with a wordline of a preselected width and the columns of cells associated with first and second bitlines, comprising the steps of:
   performing a write-without-restore operation by writing a word of data of the preselected width to a selected row of cells using the first bitlines; and
   performing a data access including refresh to a second selected row of cells substantially simultaneously with said step of performing a write-without-restore operation using the second bitlines.

15. The method of claim 14 wherein said step of performing a write-without-restore operation comprises a synchronous operation synchronized to a system clock.

16. The method of claim 15 wherein said step of performing a data access including refresh operation comprises a synchronous operation synchronized to a system clock.

17. The method of claim 14 and further comprising the steps of performing synchronous interleaved read operations to the array at a system clock rate by alternating between the first and seconds bitlines.

18. The method of claim 14 and further comprising the steps of:
   encaching data from a selected in row in the array with a cache associated with the array, the data corresponding to an address;
   comparing a received address with the address corresponding to the encached data;
   accessing the cache when the received address and the address corresponding to the encached data match; and
   accessing the array when the received address and the address corresponding to the encached data differ.

19. The method of claim 14 wherein said step of encaching comprises the step of:
   internally generating an address to access data from a row in the array having a selected locality with respect to data previously retrieved from the array; and
   transferring data from a row in the array addressed by the internally generated address to the cache.

20. The method of claim 19 wherein the selected locality comprises a selected spatial locality.

21. The method of claim 20 wherein the selected locality comprises a selected temporal locality.

* * * * *